United States Patent
Utermoehlen et al.

(10) Patent No.: US 10,907,992 B2
(45) Date of Patent: Feb. 2, 2021

(54) ROTATIONAL ANGLE SENSOR

(71) Applicant: Robert Bosch GmbH, Stuttgart (DE)

(72) Inventors: Fabian Utermoehlen, Lippstadt (DE); Andreas Merz, Freiberg am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 15 days.

(21) Appl. No.: 16/079,728

(22) PCT Filed: Dec. 27, 2016

(86) PCT No.: PCT/EP2016/082707
§ 371 (c)(1),
(2) Date: Aug. 24, 2018

(87) PCT Pub. No.: WO2017/144144
PCT Pub. Date: Aug. 31, 2017

(65) Prior Publication Data
US 2019/0025088 A1    Jan. 24, 2019

(30) Foreign Application Priority Data
Feb. 24, 2016 (DE) .................. 10 2016 202 867

(51) Int. Cl.
*G01D 5/20* (2006.01)
*G01B 7/30* (2006.01)
(Continued)

(52) U.S. Cl.
CPC ............ *G01D 5/2073* (2013.01); *G01B 7/30* (2013.01); *G01D 5/2086* (2013.01); *H02K 3/325* (2013.01);
(Continued)

(58) Field of Classification Search
CPC ..... G01D 5/2053; G01D 5/206; G01D 5/2086
See application file for complete search history.

(56) References Cited

U.S. PATENT DOCUMENTS 5,025,201 A   6/1991  Berger
6,236,199 B1  5/2001  Irle et al.
(Continued)

FOREIGN PATENT DOCUMENTS

| CN | 103925869 A | 7/2014 |
|----|-------------|--------|
| CN | 104061854 A | 9/2014 |

(Continued)

OTHER PUBLICATIONS

International Search Report corresponding to PCT Application No. PCT/EP2016/082707, dated Apr. 13, 2017 (German and English language document) (5 pages).

*Primary Examiner* — Noam Reisner
(74) *Attorney, Agent, or Firm* — Maginot, Moore & Beck LLP

(57) ABSTRACT

A rotational angle sensor includes a stator element, and rotor element. The stator element has a stator transmitting coil and a stator receiving coil. The rotor element is mounted rotatably about a rotation axis relative to the stator element, and has a rotor receiving coil and a rotor transmitting coil electrically connected with each other. The rotor receiving coil is inductively coupled to the stator transmitting coil such that an electromagnetic field produced by the stator transmitting coil induces a current in the rotor receiving coil that flows through the rotor transmitting coil and causes the rotor transmitting coil to produce a further electromagnetic field. The stator receiving coil is inductively coupled to the rotor transmitting coil such that the inductive coupling is configured with reference to a rotational angle between the stator element and the rotor element so that the further electromagnetic field induces at least one angle-dependent alternating voltage in the stator receiving coil. The stator receiving coil has at least two circular-ring-sector-shaped partial windings that divide the stator element into sectors. The rotor transmitting coil has a number of sickle-shaped partial windings equal to the number of circular-ring-sector-shaped partial windings, which extend sequentially around the rotation axis.

20 Claims, 3 Drawing Sheets

(51) Int. Cl.
*H02K 3/28* (2006.01)
*H02K 3/32* (2006.01)
*H05K 1/18* (2006.01)

(52) U.S. Cl.
CPC ........... *H05K 1/183* (2013.01); *G01D 5/2046* (2013.01); *H02K 3/28* (2013.01)

(56) References Cited

U.S. PATENT DOCUMENTS

| | | | |
|---|---|---|---|
| 6,304,076 B1 * | 10/2001 | Madni | G01D 5/2053 |
| | | | 318/660 |
| 6,628,038 B1 * | 9/2003 | Shikayama | G01B 7/30 |
| | | | 310/268 |
| 6,806,701 B2 * | 10/2004 | Apel | G01D 11/245 |
| | | | 324/207.2 |
| 8,912,794 B2 | 12/2014 | Matsuura et al. | |
| 2004/0222787 A1 * | 11/2004 | Tiemann | G01D 5/2053 |
| | | | 324/207.17 |
| 2012/0293166 A1 | 11/2012 | Lee et al. | |

FOREIGN PATENT DOCUMENTS

| | | |
|---|---|---|
| DE | 40 21 637 A1 | 1/1992 |
| DE | 11 2011 100 330 T5 | 1/2013 |
| DE | 11 2012 002 160 T5 | 3/2014 |
| EP | 0 909 955 A2 | 4/1999 |
| EP | 1 083 408 A2 | 3/2001 |
| GB | 1 395 961 A | 5/1975 |
| JP | H9-54560 A | 2/1997 |
| JP | 2003-329486 A | 11/2003 |
| JP | 3621872 B2 | 11/2004 |

* cited by examiner

ROTATIONAL ANGLE SENSOR

This application is a 35 U.S.C. § 371 National Stage Application of PCT/EP2016/082707, filed on Dec. 27, 2016, which claims the benefit of priority to Serial No. DE 10 2016 202 867.7, filed on Feb. 24, 2016 in Germany, the disclosures of which are incorporated herein by reference in their entirety.

The disclosure relates a rotational angle sensor which can be used to determine, for example, a rotational angle between a shaft and a further component.

BACKGROUND

To measure rotational angles, rotational angle sensors in which a magnet is rotated over a corresponding magnetic field sensor are known for example. The measurement of the magnetic field vector then allows the rotational angle to be deduced. Such sensors also react to external magnetic fields, which are caused for example by a current flowing through power cables arranged alongside, and can be very sensitive to interference.

Another type of rotational angle sensor uses an eddy current effect. In this case, for example, a metallic target is moved over sensor coils, which are supplied with an AC voltage and induce an eddy current in the target. This causes a reduction in the inductances of the sensor coils and allows the rotational angle to be deduced from a change in frequency. For example, the coils form part of an oscillating circuit, the resonant frequency of which shifts when there is a change in the inductance. However, this type of rotational angle sensor may have a high cross sensitivity to installation tolerances (especially tilting of the target). The frequency generated may also be disturbed by external electromagnetic fields (injection locking), since frequencies in the range of several tens of MHz are usually used.

EP 0 909 955 B1 has a rotational angle sensor with planar conductor loops which are short-circuited on a target and interact with the alternating electromagnetic field of an excitation coil.

SUMMARY

Embodiments of the present disclosure can advantageously facilitate the provision of a robust and cost-effective rotational angle sensor that requires little installation space.

Ideas relating to embodiments of the present disclosure can be considered as being based on, inter alia, the concepts and discoveries described below.

The disclosure relates to a rotational angle sensor which can be used in particular in an environment with strong electromagnetic disturbance fields. For example, the rotational angle sensor can be used in the engine compartment or in the vicinity of the engine compartment of a vehicle, for example for determining a position of a throttle valve, a rotor position of a BLDC motor, a position of a gas pedal or a position of a camshaft. The angular rotational sensor described below is cost-effective, requires little installation space and is based on a simple measuring principle.

According to an embodiment of the disclosure, the rotational angle sensor comprises a stator element having a stator transmitting coil and at least one stator receiving coil; a rotor element, rotatably mounted about an axis of rotation with respect to the stator element, having a rotor receiving coil and a rotor transmitting coil, which are electrically connected to one another; wherein the rotor receiving coil is inductively coupled to the stator transmitting coil such that an electromagnetic field produced by the stator transmitting coil induces a current in the rotor receiving coil, said current flowing through the rotor transmitting coil such that the rotor transmitting coil produces a further electromagnetic field; wherein the at least one stator receiving coil is inductively coupled to the rotor transmitting coil such that the inductive coupling depends on a rotational angle between the stator element and the rotor element and the electromagnetic field produced by the rotor transmitting coil induces at least one angle-dependent AC voltage in the at least one stator receiving coil.

Expressed differently, the stator transmitting coil can have an AC voltage applied thereto, said AC voltage inducing a further AC voltage in the rotor receiving coil by way of an inductive coupling between the stator transmitting coil and the rotor receiving coil. The AC voltage produced in the rotor receiving coil produces a current flow in the rotor transmitting coil which, by way of inductive coupling between the rotor transmitting coil and one or more stator receiving coils, produces a further AC voltage in the stator receiving coil or coils, it being possible to measure said further AC voltage and establish a relative rotational angle between the stator element and the rotor element from the measured values thereof.

The at least one stator receiving coil has at least two (or an even number of) circular-ring-sector-shaped partial windings, which subdivide the stator element in sectors, and the rotor transmitting coil has the same number of crescent-shaped partial windings (i.e., the same number as the circular-ring-sector-shaped partial windings), which surround the axis of rotation along the circumferential direction in succession. A circular-ring-sector-shaped partial winding can have a circular sector shape (for example a semicircle or a quarter circle). However, it can also have the form of a sector of a ring, i.e., a portion of a ring which is delimited by the two circular lines of the ring and by two radially extending lines.

Hence, a partial winding of the rotor transmitting coil is assigned to each partial winding of the stator receiving coil such that each partial winding of the rotor transmitting coil is able to induce an alternating field in the associated partial winding of the stator receiving coil. There is a different coverage of the crescent-shaped partial windings with the circular-ring-sector-shaped partial windings in the case of different rotational angles, leading to induced AC voltages of different magnitudes.

Further, the amplitude of the AC voltage depends on the coverage area of the crescent-shaped partial windings in the circular-ring-sector-shaped partial windings. This coverage area can be set by way of the form of the crescent-shaped partial windings. Since the coverage area does not increase linearly with the rotational angle in the case of the crescent shape, the functional dependence of the amplitude of the AC voltage on the rotational angle can be set by the form of the crescents. In particular, it is possible to set a sinusoidal dependence of the amplitude of the AC voltage on the rotational angle.

A circular-ring-sector-shaped partial winding can have two circular-arc-shaped conductor portions with different radii and two radially extending conductor portions which are connected to a ends of the circular-arc-shaped conductor portions. However, it is also possible for a circular-ring-sector-shaped partial winding to be circular-ring-sector-shaped, i.e., only have one circular-arc-shaped conductor portion which is connected via two conductor portions extending virtually to the axis of rotation in the radial direction. Further, a circular-ring-sector-shaped partial winding can also be semicircular. Here, the inner radius of the circular ring sector defining the partial winding can be preferably 5%, at most 15%, of the outer radius of the circular ring sector. The rotational angle sensor is based on a simple measuring principle and, moreover, can be realized in a cost-effective manner since there is no need for an expensive magnet on the rotor element. It requires a smaller installation space as a result of the arrangement and the form of the coils. Further, the rotational angle sensor is robust in relation to build tolerances, as a result of which costs can be saved.

According to an embodiment of the disclosure, the crescent-shaped partial windings are delimited by circular-arc-shaped conductor portions. In this way, the dependence on the rotational angle of the amplitude of the AC voltage induced in a stator receiving coil is a sine function. A sinusoidal signal dependent on the rotational angle can easily be evaluated and converted into the rotational angle. By way of example, in the case of two stator receiving coils (a two-phase system), the rotational angle can be determined by means of the arctangent from the quotient of the two signals. In the case of three stator receiving coils (three-phase system), the rotational angle can be determined by means of a Clarke transformation of the three signals and a subsequent arctangent calculation.

In general, the partial windings of the stator receiving coil and the partial windings of the rotor transmitting coil can each be arranged symmetrically about the axis of rotation. Additionally, the partial windings of the stator receiving coil and/or the partial windings of the rotor transmitting coil can have a substantially equivalent or identical embodiment. In this way, the AC voltages induced in each partial winding pair are of equal magnitude.

According to an embodiment of the disclosure, the rotor transmitting coil is constructed from two crescent-shaped partial windings of equal size. Here, the diameters of the circular-arc-shaped or circular conductor portions of a partial winding may deviate by less than 10% from one another. By way of example, the circles defining the conductor portions may have the same diameter. This advantageously yields a high signal symmetry and a simple back calculation. The center points of the circles defining the conductor portions could be offset from one another by approximately 5% of the mean diameter of the two circles, for example.

According to an embodiment of the disclosure, the rotor transmitting coil is constructed from four crescent-shaped partial windings of equal size, e.g., of equal size in terms of the area, and the ratio of the diameters of the circular-arc-shaped or circular conductor portions of a partial winding deviates by less than 10% from the square root of 2 (approximately 1.41). This causes inner conductor track portions to transition into outer conductor track portions of the adjacent crescents. This advantageously results in a particularly pronounced sinusoidal property of the signals. A deformation of the signals, for example, in the direction of a triangle function, is avoided thereby. The center points of the circles defining the conductor portions can be offset by ⅙ to ½, for example, approximately ¼, of the larger radius from one another, for example.

According to an embodiment of the disclosure, the circular-ring-sector-shaped partial windings of the stator receiving coil and the crescent-shaped partial windings of the rotor transmitting coil each have, in succession along the circumferential direction, an opposite orientation in respect of the current passing therethrough. Expressed differently, crescent-shaped partial windings of the rotor transmitting coils adjacent to one another in the circumferential direction produce electromagnetic fields that extend substantially antiparallel to one another. When these electromagnetic fields that extend antiparallel to one another are input coupled into the circular-ring-sector-shaped partial windings of the stator receiving coil, the produced AC voltages are added to one another by way of a series circuit. Conversely, voltages of a homogeneous disturbance field induced in the circular-ring-sector-shaped partial windings cancel one another out. In this way, the influence of interfering magnetic fields (for example, as a consequence of high currents within cables arranged in the vicinity of the rotational angle sensor) can be greatly reduced.

According to an embodiment of the disclosure, the crescent-shaped partial windings are only arranged in a ring region of the rotor element that surrounds the axis of rotation. In this way, an area that surrounds the axis of rotation and that can be used for further functions of the rotor element arises on the rotor element. The ring region can be defined by two concentric circles with different radii around the axis of rotation.

By way of example, the rotor receiving coil can be arranged in an inner region of the rotor element surrounding the axis of rotation and the crescent-shaped partial windings can surround this inner region. This makes a high robustness in relation to tolerances (in particular, in relation to radial displacements of the rotor element with respect to the stator element) and a very small and cost-effective sensor realizable.

According to an embodiment of the disclosure, the rotor receiving coil and/or the stator transmitting coil extend around the axis of rotation of the rotational angle sensor in circular fashion, wherein the axis of rotation may also be the center point of the circles defining the coils. As a result, a particularly homogeneous magnetic field is advantageously produced (stator transmitting coil) and/or the greatest possible component of the produced field is advantageously received (rotor receiving coil).

According to an embodiment of the disclosure, the rotor transmitting coil and the at least one stator receiving coil each have an even number of partial windings. In this way, the two coils each can have the same number of partial coils oriented in the one direction and oriented in the other direction such that external disturbance fields may be completely canceled out. Consequently, the signal received in a stator receiving coil can be substantially a sine function or cosine function oscillating about the zero line, depending on the rotational angle. This simplifies the evaluation since no complicated evaluation electronics are necessary to calculate back to the angle from the captured signal value. By way of example, the evaluation can be brought about by means of a discretely constructed circuit or by way of a very simple processor.

The term "a rotor transmitting coil" should be understood to mean "at least one rotor transmitting coil". This also applies analogously to the stator receiving coil, the stator transmitting coil and the rotor receiving coil.

According to an embodiment of the disclosure, the stator element has two stator receiving coils which are offset from one another by 90° in the circumferential direction; or wherein the stator element has three stator receiving coils which are offset from one another by 120° in the circumferential direction. A plurality of stator receiving coils which each supply a dedicated signal may increase the accuracy of the rotational angle sensor. When evaluating difference signals, voltages induced by external disturbance fields are not included in the measurement since they act on all signals in the same way. It is possible to evaluate one difference signal in the case of two stator receiving coils. It is possible to evaluate three difference signals in the case of three stator receiving coils.

According to an embodiment of the disclosure, the stator transmitting coil and the at least one stator receiving coil are planar coils which are arranged in and/or on a stator printed circuit board. Additionally, the rotor receiving coil and the rotor transmitting coil can be planar coils which are arranged in and/or on a rotor printed circuit board. The elements of the rotational angle sensor can be constructed from components that are easy to produce. By way of example, the coils can be embodied in a single layer of a printed circuit board or in two layers of a printed circuit board, wherein the conductor tracks in the two layers can be connected to one another by vias (through-contacts). As a result, it is possible to use a printed circuit board design that is particularly simple to construct and cost-effective.

BRIEF DESCRIPTION OF THE DRAWINGS

Below, embodiments of the disclosure are described with reference to the attached drawings, with neither the drawings nor the description being intended to be construed as restricting the disclosure.

The figures are only schematic and not true to scale. In the figures, the same reference signs denote the same features or features with the same effect.

DETAILED DESCRIPTION

Figure 1:
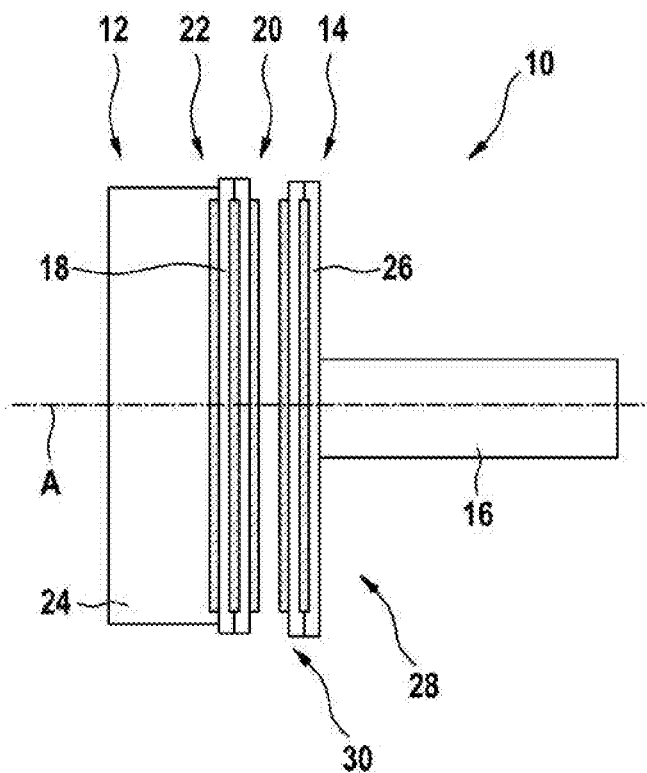
FIG. 1 schematically shows a rotational angle sensor according to an embodiment of the disclosure.

FIG. 1 shows a rotational angle sensor 10 made of a stator element 12 and a rotor element 14. The rotor element 14 can be fastened to a shaft 16 of a component, such as, for instance, a throttle valve, a motor, a camshaft, an accelerator pedal, etc., or it can be provided by said shaft 16. The shaft 16 is rotatable about the axis A and the stator element 12 lies opposite the rotor element 14 in the corresponding axial direction. By way of example, the stator element 12 is fastened to a housing of the component.

The stator element 12 comprises a stator printed circuit board 18, on which a stator transmitting coil 20 and a plurality of stator receiving coils 22 are arranged. The stator printed circuit board 18 can be a single layer, two-layer or multi-layer stator printed circuit board 18 and the conductors of the coils 20, 22 may be situated on both sides of the stator printed circuit board 18 and between the individual layers of the stator printed circuit board 18. Further structural elements for a control unit 24 may be situated on the stator printed circuit board 18. The control unit 24 can supply the stator transmitting coil 20 with an AC voltage (for example, with a frequency of between 1 MHz and 20 MHz, e.g., 5 MHz, and/or with a voltage amplitude in the range of 0.5 V to 10 V, e.g., 1.5 V) and can establish an induced AC voltage in each stator receiving coil 22. On the basis of these measurements, the control unit 24 is able to determine a relative rotational angle between the stator element 12 and the rotor element 14.

The rotor element 14 comprises a rotor printed circuit board 26. A rotor receiving coil 28 and a rotor transmitting coil 30 are arranged on the rotor printed circuit board 26. The rotor printed circuit board 26 can be a single layer, two-layer or multi-layer printed circuit board and the conductors of the coils 28, 30 may be situated on both sides of the rotor printed circuit board 26 and between the individual layers of the rotor printed circuit board 26.

Typical external dimensions (such as diameter, for instance) of the stator transmitting coil 20, the stator receiving coils 22a, 22b, the rotor receiving coil 28 and the rotor transmitting coil 30 are between 4 mm and 50 mm (preferably 12 mm).

Figures 2, 3:
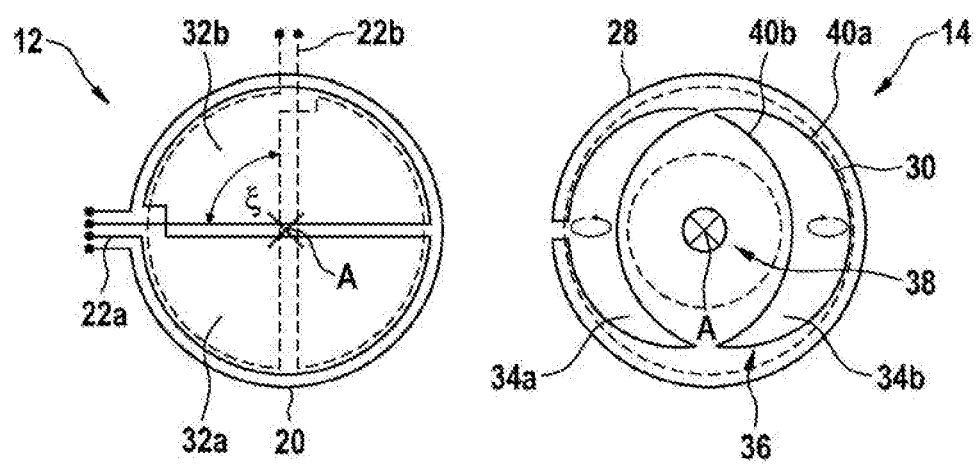
FIG. 2 schematically shows a stator element for a rotational angle sensor according to an embodiment of the disclosure.
FIG. 3 schematically shows a rotor element for a rotational angle sensor according to an embodiment of the disclosure.

FIG. 2 shows a stator element 12 for the rotational angle sensor 10 from FIG. 1 in a plan view, said stator element comprising a stator transmitting coil 20 and two stator receiving coils 22a, 22b.

The stator transmitting coil 20 is substantially circular, with the axis A representing the center point of the stator transmitting coil 20, and it completely surrounds the stator receiving coils 22a, 22b. The first and the second stator receiving coil 22a, 22b are offset from one another by 90° along the circumference and each have two opposing partial windings 32a, 32b (which are only provided with reference signs in the coil 22a). Each of the partial windings 32a, 32b is circular-ring-sector-shaped and, in particular, virtually semicircular. The partial winding 32a is oriented opposite to the winding 32b (in respect of the current flow). The two partial windings 32a, 32b of a stator receiving coil together cover substantially the entire area surrounded by the stator transmitting coil 20. As a result, a particularly high receiving signal can be brought about.

FIG. 3 shows a rotor element 14 for the rotational angle sensor 10 from FIG. 1 in a plan view, said rotor element comprising a rotor receiving coil 28 and a rotor transmitting coil 30.

The rotor receiving coil 28 is substantially circular or circular-arc-shaped, with the axis A representing the center point of the stator transmitting coil 20, and it completely surrounds the rotor transmitting coil 30. The rotor receiving coil 28 and the rotor transmitting coil 30 are electrically connected to one another with their ends, i.e., short-circuited, for example, or they are connected in series. The rotor receiving coil 28 can surround the same area as the stator transmitting coil 20 and/or be flush with the latter in relation to the axis of rotation A. The geometries of the stator transmitting coil 20 and of the rotor receiving coil 28 may be identical. It is also possible for the stator transmitting coil 20 and the rotor receiving coil 28 to differ in terms of the diameter and/or in the number of individual conductors, from which the respective coil is composed. Thus, for example, the stator transmitting coil 20 may have two, three, four or more conductor coils in the same sense in order to produce a high alternating field.

The rotor transmitting coil 30 has two opposing partial windings 34a, 34b, which are crescent-shaped in each case. The first partial winding 34a is oriented in the opposite sense in relation to the second partial winding 34b (in respect of the current flow). The geometries of the partial windings 34a, 34b can be identical. The partial windings 34a, 34b are situated in a ring region 36, which surrounds the axis of rotation A, and arranged outside of an inner region 38, which is not covered by the rotor transmitting coil 30.

The two crescent-shaped partial windings 34a, 34b are formed from substantially circular-arc-shaped conductor portions 40a, 40b, which cross at the transition point between the crescent-shaped partial windings 34a, 34b. At the crossing points, the partial windings 34a, 34b may be arranged in different layers of the rotor printed circuit board 26.

An alternating electromagnetic field arises if the control unit 24 applies an AC voltage to the stator transmitting coil 20, said alternating electromagnetic field being able to be received by the rotor receiving coil 28 and inducing a voltage there, the latter producing a current flow. To this end, it is possible to choose the distance between the stator printed circuit board 18 and the rotor printed circuit board 26 in such a way, for example, that the stator printed circuit board 18 is situated in the near field of the rotor printed circuit board 26.

The electromagnetic field of the stator transmitting coil 20 substantially cannot induce any current flow in the stator receiving coils 22a, 22b and the rotor transmitting coil 30 on account of the opposing partial windings 32a, 32b and 34a, 34b, respectively. The current induced in the rotor receiving coil 28 also flows through the rotor transmitting coil 30, which, as a result thereof, produces with its partial windings 34a, 34b two oppositely oriented alternating electromagnetic fields.

These alternating fields induce an alternating current in the stator receiving coils 22a, 22b, said alternating current depending for each of the stator receiving coils 22a, 22b on the relative rotational angle of the stator element 12 in relation to the rotor element 14.

The alternating current induced in the stator receiving coils 22a, 22b depends substantially linearly on the relative coverage of the circular-ring-sector-shaped partial windings 32a, 32b of the stator receiving coils 22a, 22b and the crescent-shaped partial windings 34a, 34b of the rotor transmitting coil 30. On account of the selection of the geometries of the partial windings, the relative coverage area does not depend linearly on the rotational angle and the amplitude of the induced AC voltage depending on the rotational angle can be set by the choice of the geometry of the crescent-shaped partial windings 34a, 34b. By way of example, as explained in more detail below, the amplitude of the induced AC voltage may depend on the sine of the rotational angle. This simplifies the evaluation of the signal produced by the stator receiving coils 22a, 22b.

Figure 4:
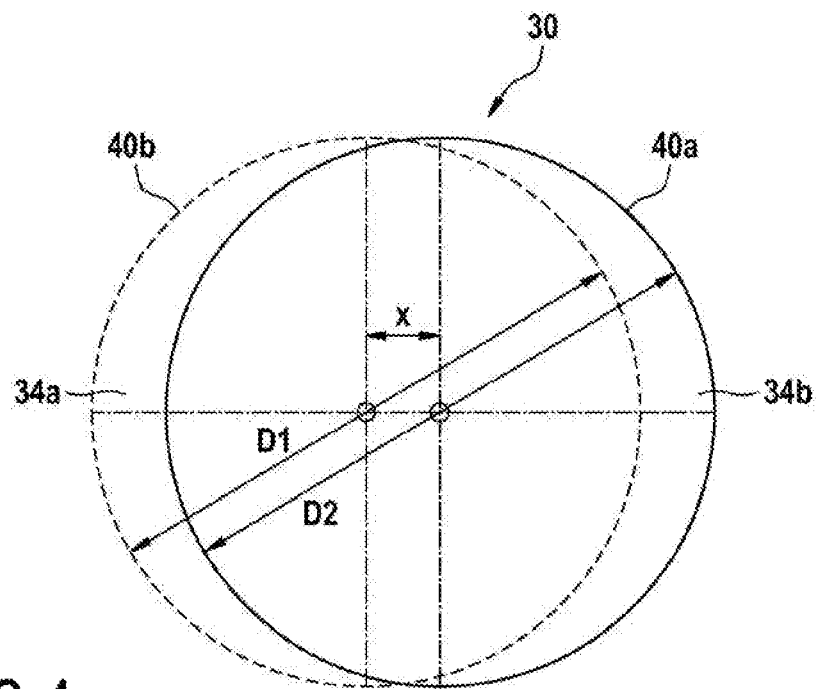
FIG. 4 shows a diagram in which the geometric relationships of the rotor element from FIG. 3 are explained.

FIG. 4 shows a diagram explaining the geometry of the rotor transmitting coil 30 and the partial windings 34a, 34b thereof. The circular-arc-shaped conductor portions 40a, 40b are defined by two circles with the diameters D1 and D2 (i.e., they extend substantially on these circles), the center points of which are displaced in relation to one another by the distance x. The two diameters D1 and D2 can be chosen to be approximately identical. The distance x can be chosen to be in the range of $0.05 < x/D < 0.5$ in relation to the mean diameter $D=(D1+D2)/2$, where, preferably, $x/D=0.15$. The diameters lie between 4 mm and 20 mm, for example, and preferably at 12 mm.

Figures 5, 6:
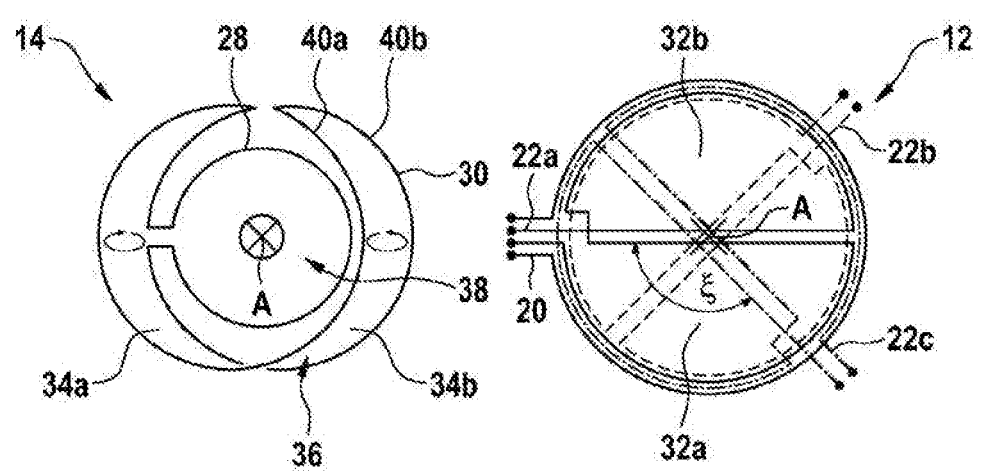
FIG. 5 schematically shows a rotor element for a rotational angle sensor according to a further embodiment of the disclosure.
FIG. 6 schematically shows a stator element for a rotational angle sensor according to a further embodiment of the disclosure.

FIG. 5 shows a further rotor element 14, which can be used together with the stator element 12 from FIG. 2. In the rotor element 14, the rotor receiving coil 28 is arranged within the rotor transmitting coil 30. The rotor receiving coil 28 is situated in the inner region 38 within the ring region 36.

As a result of the crescent-shaped partial windings 34a, 34b of the rotor transmitting coil 30, the inner region 38 can be used to integrate the rotor receiving coil 28 there. This may be advantageous in that, firstly, it is possible to manufacture the rotor element 14 in a smaller and more cost-effective manner and in that, secondly, the amplitude of the AC voltage induced in the rotor receiving coil 28 does not depend on lateral displacements between the rotor element 14 and the stator element 12.

FIG. 6 shows a further embodiment of a stator element 12, which can be used together with the rotor elements 14 from FIGS. 3 and 5. The stator element 12 comprises a first stator receiving coil 22a, a second stator receiving coil 22b and a third stator receiving coil 22c, which are offset from one another by 120° (and which can each be constructed like the stator receiving coils 22a, 22b from FIG. 2).

Three different AC voltages (for instance, signal1, signal2, signal3) are induced in the stator element 12 as a result of three stator receiving coils 22a, 22b, 22c, said AC voltages consequently leading to a three-phase signal, which can be evaluated. In particular, it is possible to evaluate not only the directly induced AC voltages but also their mutual differences. An offset that is present can be compensated by evaluating the differences signal1-signal2, signal2-signal3 and signal3-signal1, and it is possible to obtain a more pronounced sinusoidal property. The back calculation into the rotational angle can be carried out easily and robustly by means of a Clarke transformation.

Rotational angle sensors 10, which are constructed using the stator elements 12 and rotor elements 14 shown in FIGS. 2 to 6, have a periodicity or measurement range of 360°. Since no 360° periodicity is required for many applications, such as the rotational angle identification of a throttle valve, FIGS. 7 to 10 describe variants with a 180° periodicity.

Figures 7, 8:
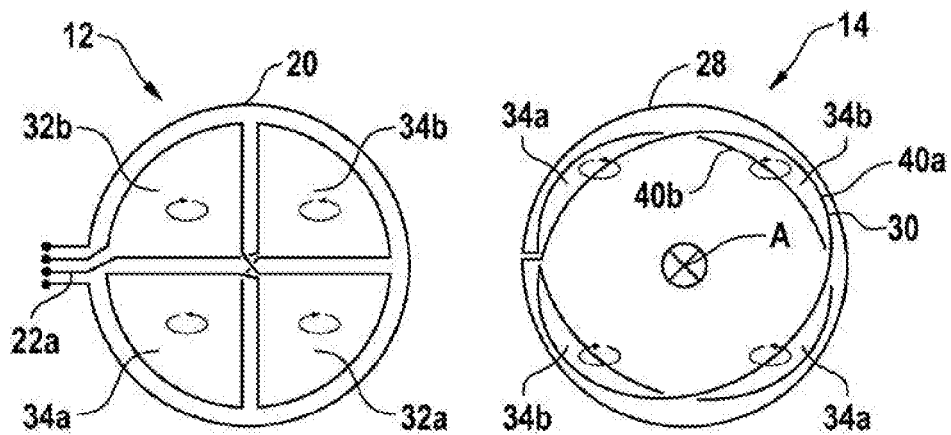
FIG. 7 schematically shows a stator element for a rotational angle sensor according to a further embodiment of the disclosure.
FIG. 8 schematically shows a rotor element for a rotational angle sensor according to a further embodiment of the disclosure.

FIG. 7 shows a stator element 12 with a stator receiving coil 22a, which is constructed of four equal circular-ring-sector-shaped (in this case, quarter-circle-shaped) partial windings 34a, 34b. The partial windings 32a, 32b have alternating orientation in the circumferential direction about the axis of rotation A. The stator elements 12 may have further stator receiving coils which are constructed like the stator receiving coil 22a and which are offset by a certain angle in relation to the stator receiving coil, as explained in more detail below. By way of example, in the case of two stator receiving coils 22a, the two stator receiving coils 22a can be offset by 45° from one another.

In general, a stator receiving coil 22a may have an identical number of partial windings 32a, 32b running to the right and running to the left, totaling n/2 in each case. This leads to the partial AC voltages induced by the stator transmitting coil 20 compensating when summed and 0 V being output at all receiving coils 22a as an output signal. This fact can also be used for self-diagnostics because the rotational angle sensor 10 can thus identify that the rotor element 12 is either missing or at least has an electrical interruption.

The number n of partial windings 32a, 32b present in total sets the periodicity of the rotational angle sensor 10, i.e. the range of uniqueness of the signals or the measurement range. It is also advantageous if the number of crescent-shaped partial windings 34a, 34b on the rotor element 14 equals the number n of the circular-ring-sector-shaped partial windings 32a, 32b on the stator element 12.

The following applies to the periodicity Per:

Per=360°/(n/2).

The required geometric twist of the stator receiving coils 22a, 22b, 22c in relation to one another also emerges from this periodicity Per and the number m of stator receiving coils 22a, 22b, 22c (see FIGS. 2 and 6) as:

ξ=Per/(2·m) for m=2 and ξ=Per/m for m≥3

On account of the n=2 partial windings 32a, 32b, a periodicity of 360° emerges for FIGS. 2 to 6 and, accordingly, a geometric twist of the receiving coils through 90° (FIG. 2) emerges for a two-phase system (m=2). Accordingly, 120° (FIG. 6) arises in the case of a three-phase system.

For FIG. 7, a periodicity of 180° arises in the case of n=4 partial windings 32a, 32b and, accordingly, a geometric twist of the receiving coils through 45° emerges for a two-phase system (m=2). In the case of a three-phase system with m=3, 60° arises accordingly.

FIG. 8 now shows a rotor element 14 for the stator element 12 from FIG. 7, which has four equally shaped crescent-shaped partial windings 34a, 34b. The partial windings 34a, 34b have an alternating orientation in the circumferential direction about the axis of rotation A. Just like the partial windings 32a, 32b of a stator receiving coil 22a on the corresponding stator element 12 from FIG. 7, the crescent-shaped partial windings 34a, 34b are geometrically displaced in relation to one another through 90° in the circumferential direction.

Figure 9:
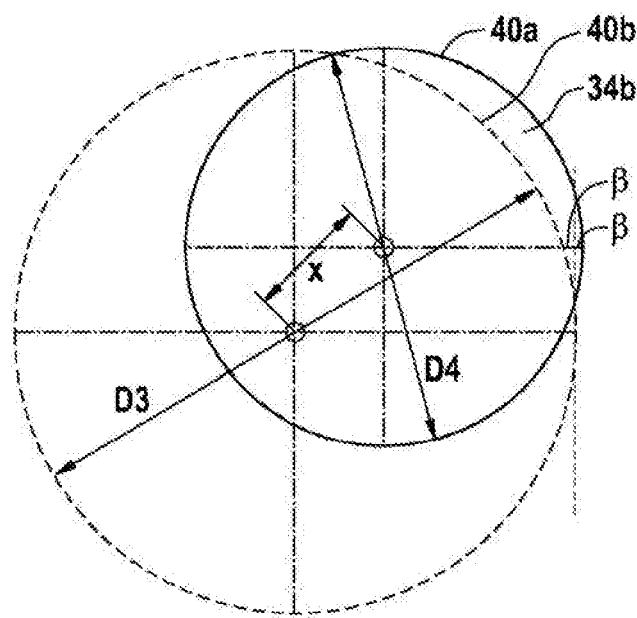
FIG. 9 shows a diagram in which the geometric relationships of the rotor element from FIG. 8 are explained.

As emerges from FIG. 9, the geometry of the crescent-shaped partial windings 34a, 34b can be defined again via two circles with diameters D3 and D4, the centers of which are offset from one another by the distance x. Each of the partial windings 34a, 34b is delimited by two circular-arc-shaped conductor portions 40a, 40b, which substantially extend on these two circles.

It was found that the best signal can be obtained in a stator receiving coil 22a if the circle diameters D3 and D4 have a ratio of the square root of 2. The distance x can be chosen in such a way that the two angles β, which are formed at the points of intersection of the circles, substantially have the same size. Here, an angle β is defined by a circumference proceeding from the point of intersection and a straight line through the point of intersection which extends at an angle of 45° to the distance x. To this end, x/D3 is chosen, expediently, for instance, in the range of ⅙ to ½, for example ¼.

Figure 10:
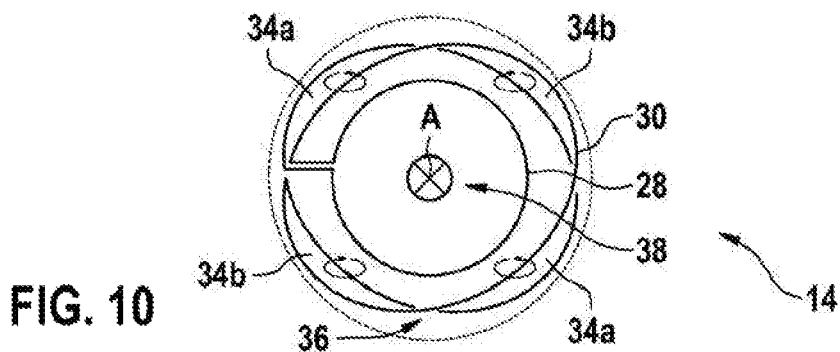
FIG. 10 schematically shows a rotor element for a rotational angle sensor according to a further embodiment of the disclosure.

FIG. 10 shows a rotor element 14 that is analogous to FIG. 5, in which the rotor receiving coil 28 is arranged within the rotor transmitting coil 30.

As a last point, reference should be made to the fact that terms such as "having", "comprising", etc. do not exclude any other elements or steps and that terms such as "a" or "one" do not exclude a multiplicity. Reference signs in the claims should not be construed to be a restriction.

The invention claimed is:

1. A rotational angle sensor, comprising:
   a stator element including:
      a stator transmitting coil; and
      at least one stator receiving coil having at least two circular-ring-sector-shaped partial windings which subdivide the stator element in sectors in the circumferential direction; and
   a rotor element mounted so as to be rotatable about an axis of rotation relative to the stator element, and including:
      a rotor receiving coil; and
      a rotor transmitting coil having a number of crescent-shaped partial windings corresponding to the number of circular-ring-sector-shaped partial windings on the at least one stator receiving coil, the crescent-shaped partial windings successively surrounding the axis of rotation along a circumferential direction;
   wherein the rotor receiving coil and the rotor transmitting coil are electrically connected to each other;
   wherein the rotor receiving coil is inductively coupled to the stator transmitting coil such that an electromagnetic field produced by the stator transmitting coil induces a current in the rotor receiving coil, said current flowing through the rotor transmitting coil such that the rotor transmitting coil produces a further electromagnetic field; and
   wherein the at least one stator receiving coil is inductively coupled to the rotor transmitting coil such that the inductive coupling between the at least one stator receiving coil and the rotor transmitting coil is configured with reference to a rotational angle between the stator element and the rotor element, and such that the further electromagnetic field produced by the rotor transmitting coil induces at least one angle-dependent AC voltage in the at least one stator receiving coil.

2. The rotational angle sensor as claimed in claim 1, wherein the rotor transmitting coil further includes circular-arc-shaped conductor portions that delimit the crescent-shaped partial windings.

3. The rotational angle sensor as claimed in claim 2, wherein:
   the rotor transmitting coil is formed by two crescent-shaped partial windings; and
   the two crescent-shaped partial windings are of equal size.

4. The rotational angle sensor as claimed in claim 3, wherein diameters of the circular-arc-shaped conductor portions of the two crescent-shaped partial windings deviate by less than 10% from each other.

5. The rotational angle sensor as claimed in claim 2, wherein:
   the rotor transmitting coil is formed by four crescent-shaped partial windings; and
   the four crescent-shaped partial windings are of equal size.

6. The rotational angle sensor as claimed in claim 5, wherein a ratio of diameters of an inner conductor portion of the circular-arc-shaped conductor portions to an outer conductor portion of the circular arc-shaped conductor portions of the partial windings is within 10% of the square root of 2.

7. The rotational angle sensor as claimed in claim 2, wherein:
   the rotor transmitting coil is formed by two crescent-shaped partial windings; and
   diameters of the circular-arc-shaped conductor portions of the two crescent-shaped partial windings deviate by less than 10% from each other.

8. The rotational angle sensor as claimed in claim 2, wherein:
   the rotor transmitting coil is formed by four crescent-shaped partial windings; and
   a ratio of diameters of an inner conductor portion of the circular-arc-shaped conductor portions to an outer conductor portion of the circular arc-shaped conductor portions of the partial windings is within 10% of the square root of 2.

9. The rotational angle sensor as claimed in claim 1, wherein the circular-ring-sector-shaped partial windings of one of the at least one stator receiving coils and the crescent-shaped partial windings of the rotor transmitting coil each have, in succession along the circumferential direction, an opposite orientation with respect to a respective current passing therethrough.

10. The rotational angle sensor as claimed in claim 1, wherein the crescent-shaped partial windings are only arranged in a ring region of the rotor element that surrounds the axis of rotation.

11. The rotational angle sensor as claimed in claim 10, wherein the rotor receiving coil is positioned in an inner region of the rotor element surrounding the axis of rotation, and the crescent-shaped partial windings surround the inner region.

12. The rotational angle sensor as claimed in claim 1, wherein at least one of the rotor receiving coil and the stator transmitting coil extends around the axis of rotation of the rotational angle sensor in circular fashion.

13. The rotational angle sensor as claimed in claim 1, wherein the rotor transmitting coil and the at least one stator receiving coil each have an even number of partial windings.

14. The rotational angle sensor as claimed in claim 1, wherein the at least two stator element coils includes two stator receiving coils, which are offset from each other by 90° in the circumferential direction.

15. The rotational angle sensor as claimed in claim 1, wherein the stator transmitting coil and the at least one stator receiving coil are planar coils arranged in and/or on a stator printed circuit board.

16. The rotational angle sensor as claimed in claim 15, wherein the rotor receiving coil and the rotor transmitting coil are planar coils arranged in and/or on a rotor printed circuit board.

17. The rotational angle sensor as claimed in claim 1, wherein the crescent-shaped partial windings are configured such that an amplitude of the at least one angle-dependent AC voltage is based on a sine wave that is dependent on the rotational angle between the stator element and the rotor element.

18. The rotational angle sensor as claimed in claim 1, wherein the rotor receiving coil is positioned in an inner region of the rotor element surrounding the axis of rotation, and the crescent-shaped partial windings surround the inner region.

19. The rotational angle sensor as claimed in claim 1, wherein the at least one stator receiving coil includes three stator receiving coils which are offset from each other by 120° in the circumferential direction.

20. The rotational angle sensor as claimed in claim 1, wherein the rotor receiving coil and the rotor transmitting coil are planar coils arranged in and/or on a rotor printed circuit board.

* * * * *